(12) United States Patent
Lennon et al.

(10) Patent No.: US 7,814,862 B2
(45) Date of Patent: Oct. 19, 2010

(54) METHOD OF FORMING STRUCTURES USING DROP-ON-DEMAND PRINTING

(75) Inventors: Alison Joan Lennon, Balmain (AU); Peter Kirkland Thomson, Beaumont Hills (AU); Nicolas Rowland Bingham, North Ryde (AU)

(73) Assignee: Canon Kabushiki Kaisha, Tokyo (JP)

( * ) Notice: Subject to any disclaimer, the term of this patent is extended or adjusted under 35 U.S.C. 154(b) by 1038 days.

(21) Appl. No.: 11/432,626

(22) Filed: May 12, 2006

(65) Prior Publication Data

US 2007/0110893 A1    May 17, 2007

(30) Foreign Application Priority Data

May 19, 2005    (AU) ............... 2005202167

(51) Int. Cl.
*B05C 5/02*    (2006.01)
(52) U.S. Cl. ............ 118/641; 118/642; 118/643; 118/696; 118/712; 118/323; 347/102; 700/119
(58) Field of Classification Search ......... 118/641–643, 118/696, 712, 323; 347/2, 102; 700/119; 425/174, 174.4, 375
See application file for complete search history.

(56) References Cited

U.S. PATENT DOCUMENTS

| | | | | |
|---|---|---|---|---|
| 4,575,330 A | 3/1986 | Hull | ............... | 425/174.4 |
| 4,752,498 A | 6/1988 | Fudim | ............... | 427/54.1 |
| 4,801,477 A | 1/1989 | Fudim | ............... | 427/54.1 |
| 5,121,329 A | 6/1992 | Crump | ............... | 364/468 |
| 5,594,652 A * | 1/1997 | Penn et al. | ............... | 700/119 |
| 6,259,962 B1 * | 7/2001 | Gothait | ............... | 700/119 |
| 6,503,831 B2 | 1/2003 | Speakman | ............... | 438/674 |
| 6,523,920 B2 | 2/2003 | Wade et al. | ............... | 347/3 |
| 6,697,694 B2 | 2/2004 | Mogensen | ............... | 700/119 |
| 6,713,389 B2 | 3/2004 | Speakman | ............... | 438/674 |
| 2004/0041892 A1 | 3/2004 | Yoneyama et al. | ............... | 347/102 |

FOREIGN PATENT DOCUMENTS

WO    WO 03/018645 A1    3/2003

OTHER PUBLICATIONS

Chung, J. et al., "In-tandem deposition and sintering of printed gold nanoparticle inks induced by continuous Gaussian laser irradiation" Applied Physics A, vol. 79, pp. 1259-1261, 2004.

\* cited by examiner

*Primary Examiner* — Laura Edwards
(74) *Attorney, Agent, or Firm* — Fitzpatrick, Cella, Harper & Scinto

(57) ABSTRACT

A method and apparatus are described for forming a structure on a substrate. The structure may be a circuit element. The method uses a digital specification 910 for forming the structure, including specifications for printing and curing. The structure is printed (step 112) using a drop-on-demand printer 400, wherein the printing dispenses at least one material on the substrate 420 according to the digital specification 910. The structure is cured (step 130) by irradiating the dispensed material from one or more electromagnetic radiation sources 520, 525 in the printer 400, wherein curing parameters are specified by the digital specification 910 to obtain a desired electrical property when the structure is a circuit element. The curing specification may specify the intensity of the irradiation and the location of irradiation points in the print region.

6 Claims, 12 Drawing Sheets

(CIRCUIT)

(CIRCUIT
ELEMENTS)

(CURING)

7 flashes ≡ ▇
3 flashes ≡ ▨
4 flashes ≡ ▩

METHOD OF FORMING STRUCTURES USING DROP-ON-DEMAND PRINTING

CROSS-REFERENCE TO RELATED PATENT APPLICATIONS

This application claims the right of priority under 35 U.S.C. §119 based on Australian Patent Application No. 2005202167, filed 19 May 20056, which is incorporated by reference herein in its entirety as if fully set forth herein.

COPYRIGHT NOTICE

This patent specification contains material that is subject to copyright protection. The copyright owner has no objection to the reproduction of this patent specification or related materials from associated patent office files for the purposes of review, but otherwise reserves all copyright whatsoever.

TECHNICAL FIELD OF THE INVENTION

The present invention relates to the formation of physical structures using drop-on-demand printing. In particular, the present invention relates to the formation of circuit elements using drop-on-demand printing.

BACKGROUND

Conventional methods for forming structures such as electronic circuits involve plating, lithography and etching steps. These methods are well suited for high-volume production. However, they involve many steps and much wasted material as exposed photoresist is etched away. In another approach, three-dimensional structures can be formed by depositing layer after layer of material using drop-on demand printing methods. Electronic circuit elements are an example of such structures, which can be formed by printing a number of discrete layers on a substrate using materials having specific electrical properties. For example, a transistor can be formed by printing conducting, semiconducting and insulating materials in a particular layered pattern.

Drop-on-demand printing is a known printing technique where a droplet of ink is ejected by a thermal or piezoelectric inkjet print head. The droplet is ejected onto a substrate where the droplet dries and forms a dot of a pattern (e.g., a printed photo). In contrast to etching procedures, there is no wasted material.

A three-dimensional structure can be formed by dispensing layers of materials according to the patterns determined by a three-dimensional digital representation. Crump in U.S. Pat. No. 5,121,329, issued on 9 Jun. 1992, describes a method of forming three-dimensional structures using a dispensing head connected to a CAD system. The dispensing head can dispense material at a controlled rate onto a substrate in a predetermined pattern dictated by the CAD system. Materials are heated above their solidification temperatures and dispensed as fluids, which then solidify after deposition and cooling. This method is limited to materials that can be solidified in this way.

The formation of three-dimensional structures by selectively irradiating liquid photo-curable polymers has also been described in U.S. Pat. No. 4,575,330 (issued to Hull on 11 Mar. 1986), and U.S. Pat. Nos. 4,752,498 and 4,801,477 (issued to Fudim on 21 Jun. 1988 and 31 Jan. 1989, respectively). This technique, which is known as photosolidication, involves focussing ultraviolet (UV) light in a predetermined pattern either over the surface of a layer of liquid or within the volume of a liquid to cure (solidify) polymer material. Although this method also enables the design of objects using a CAD package, it is limited in the way different materials can be incorporated in the object as the liquids mix before curing.

U.S. Pat. Nos. 6,503,831 and 6,713,389 (issued to Speakman on 7 Jan. 2003 and 30 Mar. 2004 respectively) describe drop-on-demand printing of inks for electronic circuit elements. Curing (or solidification) of printed material is achieved using conventional drying and/or radiation-enhanced drying or curing. The curing process can include radiation-induced cross-linking of organic materials. In particular, Speakman describes a radiation source close to the nozzle (on the print head) that can be used to treat deposited material either before, during or after deposition. One of the advantages of irradiating in-flight is to partially cure the material before deposition and thus reduce dot sizes before impact on the substrate. In general, the term "cure" with relation to polymer materials is used to refer to solidification of the deposited material.

Mogensen in U.S. Pat. No. 6,697,694 issued on 24 Feb. 2004 describes a similar method for printing flexible circuits by printing layers of materials using techniques that include drop-on-demand printing. In this patent, a method and apparatus is described whereby materials are dispensed on a flexible substrate in a predetermined pattern using a dispensing unit which can plot patterns using motions in the x, y and z axes relative to the substrate. Printed material is then cured by a separate curing unit, which can also be moved relative to the substrate. Layers are formed by successively printing and then curing each layer. The described curing unit can either provide UV, infrared, or gamma radiation. Alternatively, curing can be achieved using heating methods.

U.S. Patent Application No. 2004/0041892 (Yoneyama et al.) describes a method of tuning the power of the curing irradiation (used with polymer inks) depending on the humidity measured by a sensor located close to the print head. The irradiation power is controlled within the circuitry of the printer and is used simply to maximise the polymerisation of the deposited ink.

Drop-on-demand printing has also been used to deposit inorganic nanoparticle materials that can be cured to form conductive elements. In these cases, the curing process results in the nanoparticles sintering or fusing to form conductive elements which have a lower resistance. In particular, curing of metal nanoparticle films has been achieved by heating the printed inks to temperatures of 150 to 200° C. However, this heating step limits substrates that can be used to those that can survive the curing temperatures required. More recently, Chung et al. have described a method of sintering metal nanoparticle films by irradiating the films with an Argon ion laser (514 nm) in "In-tandem deposition and sintering of printed gold nanoparticle inks induced by continuous Gaussian laser irradiation" published in Applied Physics A, volume 79, 1259-1261 in 2004. Like heat curing, laser irradiation can cause coalescence of the individual nanoparticles resulting in conductive gold films. Curing of nanoparticle inks using white light irradiation (provided by flash lamps used by cameras) has also been described in the PCT Patent Publication No. WO 03/018645 (Reda et al.). These irradiation methods of curing are advantageous because the curing step does not necessarily damage the substrate thus allowing a wider range of substrates to be used (e.g., flexible plastics).

SUMMARY

It is an object of the present invention to substantially overcome, or at least ameliorate, one or more disadvantages of existing arrangements.

The arrangements described herein relate to methods of printing and curing nanoparticle films using a system in which an operator can design and form a three-dimensional structure. Irradiation parameters may be varied in a controlled way to form structures having designed physical or electrical properties.

According to a first aspect of the invention there is provided a method of forming a circuit element on a substrate, said method comprising the steps of:

selecting a digital specification for forming the circuit element;

printing the circuit element using a drop-on-demand printer, wherein said printing step dispenses at least one material on the substrate according to the digital specification; and curing the circuit element by irradiating the dispensed material from one or more electromagnetic radiation sources in the printer, wherein curing parameters of said curing step are specified by the digital specification to obtain a desired electrical property of the circuit element.

According to a second aspect of the invention there is provided a method of forming a structure on a substrate, said method comprising the steps of:

selecting a digital representation for the structure;

identifying at least one region in the digital representation;

printing the identified region using a drop-on-demand printer, wherein at least one material is dispensed on the substrate according to said digital representation; and curing the region according to the digital representation by irradiating the dispensed material from one or more electromagnetic radiation sources, wherein the digital representation specifies the intensity of the irradiation and the location of irradiation points in the region.

According to a further aspect of the invention there is provided an apparatus for forming a circuit element on a substrate, said apparatus comprising:

means for selecting a digital specification for forming the circuit element;

means for printing the circuit element using a drop-on-demand technique, wherein at least one material is dispensed on the substrate according to the digital specification; and means for curing the circuit element by irradiating the dispensed material from one or more electromagnetic radiation sources, wherein curing parameters are specified by the digital specification to obtain a desired electrical property of the circuit element.

According to a further aspect of the invention there is provided an apparatus for of forming a structure on a substrate, said apparatus comprising:

means for selecting a digital representation for the structure;

means for identifying at least one region in the digital representation;

means for printing the identified region using a drop-on-demand technique, wherein at least one material is dispensed on the substrate according to said digital representation; and means for curing the region according to the digital representation by irradiating the dispensed material from one or more electromagnetic radiation sources, wherein the digital representation specifies the intensity of the irradiation and the location of irradiation points in the region.

According to a further aspect of the invention there is provided a system for forming a circuit element on a substrate comprising:

data storage containing one or more digital specifications for circuit elements;

a printer in communication with said data storage for forming a selected circuit element, said printer comprising:

one or more cartridges for depositing material from said one ore more cartridges onto the substrate using a drop-on-demand technique, wherein the depositing is performed according to the digital specification for the selected circuit element; and one or more sources of electromagnetic radiation for curing the deposited material by irradiating the dispensed material, wherein curing parameters are specified by the digital representation to obtain a desired electrical property of the circuit element.

According to a further aspect of the invention there is provided a system for forming a structure on a substrate comprising:

data storage containing one or more digital specifications for structures;

a printer in communication with said data storage for forming a selected structure, said printer comprising:

one or more cartridges for depositing material from said one ore more cartridges onto the substrate using a drop-on-demand technique, wherein the depositing is performed according to the digital specification for the selected structure; and one or more sources of electromagnetic radiation for curing the deposited material, wherein the digital specification for the selected structure specifies radiation intensity and locations of irradiation points on the substrate.

According to a further aspect of the invention there is provided a computer program product comprising machine-readable program code recorded on a machine-readable recording medium, for controlling the operation of a data processing machine on which the program code executes to perform a method of forming a circuit element on a substrate, said method comprising the steps of:

selecting a digital specification for forming the circuit element;

instructing the operation of a drop-on-demand printer to print the circuit element, wherein the printer dispenses at least one material on the substrate according to the digital specification; and instructing the operation of one or more irradiation sources in the printer to cure the circuit element by irradiating the dispensed material, wherein curing parameters are specified by the digital specification to obtain a desired electrical property of the circuit element.

According to a further aspect of the invention there is provided a computer program product comprising machine-readable program code recorded on a machine-readable recording medium, for controlling the operation of a data processing machine on which the program code executes to perform a method of forming a structure on a substrate, said method comprising the steps of:

selecting a digital representation for the structure;

identifying at least one region in the digital representation;

instructing the operation of a drop-on-demand printer to print the identified region, wherein at least one material is dispensed on the substrate according to said digital representation; and instructing the operation of one or more electromagnetic radiation sources to cure the region according to the digital representation by irradiating the dispensed material, wherein the digital representation specifies the intensity of the irradiation and the location of irradiation points in the region.

According to a further aspect of the invention there is provided a computer program comprising machine-readable program code for controlling the operation of a data processing apparatus on which the program code executes to perform a method of forming a circuit element on a substrate, said method comprising the steps of:

selecting a digital representation for the circuit element;

identifying at least one region in the digital representation;

instructing the operation of a drop-on-demand printer to print the identified region, wherein the printer dispenses at least one material on the substrate according to the digital representation; and instructing the operation of one or more irradiation sources in the printer to cure the region by irradiating the dispensed material, wherein curing parameters are specified by the digital representation to obtain a desired electrical property of the circuit element.

According to a further aspect of the invention there is provided a computer program comprising machine-readable program code for controlling the operation of a data processing apparatus on which the program code executes to perform a method of forming a structure on a substrate, said method comprising the steps of:

selecting a digital representation for the structure;

identifying at least one region in the digital representation;

instructing the operation of a drop-on-demand printer to print the identified region, wherein at least one material is dispensed on the substrate according to said digital representation; and instructing the operation of one or more electromagnetic radiation sources to cure the region according to the digital representation by irradiating the dispensed material, wherein the digital representation specifies the intensity of the irradiation and the location of irradiation points in the region.

Other aspects of the present invention are also disclosed.

BRIEF DESCRIPTION OF THE DRAWINGS

One or more embodiments of the invention are described below with reference to the drawings, in which.

DETAILED DESCRIPTION INCLUDING BEST MODE

Overview

Figure 1:
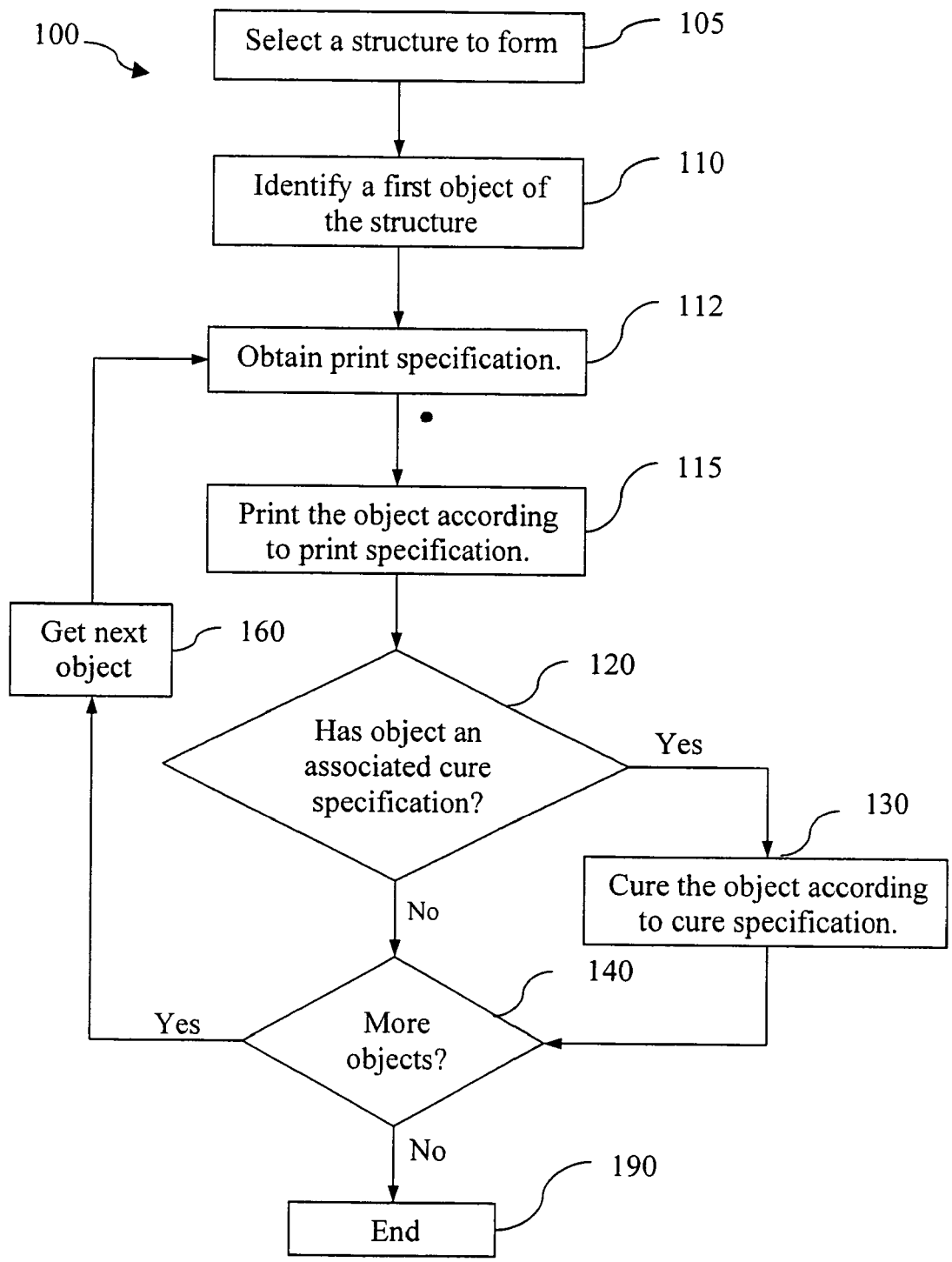
FIG. 1 is a flowchart showing a method of forming a structure, such as a conductive element.

In the following description, reference is made to the accompanying drawings which form part hereof. The drawings illustrate specific arrangements in which the invention may be practiced. It is understood that other arrangements may also be utilized and structural changes could be made without departing from the scope of the present invention.

The described arrangements provide a programmable method for forming physical structures, and in particular circuit elements, using a drop-on-demand printing device. Materials for a structure are deposited on a substrate and then cured in a programmed way to obtain structures having the desired physical and electrical properties. The formed structures can be three-dimensional structures, such as plastic mouldings, or electrical circuits and their components.

The term "drop-on-demand" printing includes but is not limited to the use of a digitally defined pressure pulse to force a fluid meniscus out of a nozzle and on to a substrate surface. The pressure pulse can be thermally, piezoelectrically, magnetically or otherwise generated. The most common methods employed for drop-on demand printing are thermal and piezoelectric inkjets.

In conventional imaging, images to be printed are typically represented using any of the known pixel-based image formats such as TIFF, JPEG, PNG, etc. The colour of individual pixels in a colour image representation is typically represented as a sequence of intensity values in a particular colour space. For example, in the RGB colour space each pixel is represented by a red (R), green (G) and blue (B) intensity value. The collection of intensity values for a particular colour/parameter of a colour space in the image representation is often referred to as a channel. When image representations are printed, the pixels of the colour image format are converted to dots of different colour ink on a page. Most commercial inkjet printers contain a number of ink cartridges (e.g., Cyan, Magenta, Yellow and blacK). During printing, each pixel of the image is mapped to an arrangement of dots, which are dispensed from the ink cartridges and deposited onto the substrate to resemble the desired colour of the pixel. So, for example, to print a red pixel, dots of magenta and yellow ink are deposited to achieve the required shade of red.

In conventional imaging (e.g., photo printing), the materials being deposited are pigment-based or dye-based inks. These inks interact with the substrate to form, on drying, an image as defined by the programmed image representation. In some cases, each pixel in the image may correspond to one dot of ink on the page. However, for most inkjet printers which employ small droplet sizes such as 2 pL or less, software and/or firmware is used to convert a pattern of pixels into a corresponding pattern of dots. In many cases, a pixel in an image will correspond to more than one drop of deposited ink on a page.

In an analogous way, materials which are used to form structures having specific structural or electrical properties, can also be deposited on a substrate using a drop-on-demand printing device according to a programmed representation of the desired structure to be formed. In many cases, the structures to be formed are three-dimensional. They can be formed by depositing a number of layers of one or more materials on a substrate. Typically, this process requires a curing procedure to be effected between layers to dry or cure the printed material to form a solid and not over-wet the substrate. Liquid polymeric materials can be deposited and then cured to form a solid material by initiating a polymerisation reaction by irradiating the deposited material using ultraviolet electromagnetic radiation. The formation of solid structures by curing using electromagnetic irradiation of liquid polymer materials is described in, for example, published U.S. Patent Application No. 20040041892, filed 25 Aug. 2003 and will not be described further here.

Deposited materials can include polymer-based materials or metal nanoparticle materials. These materials can be provided in cartridges containing either liquid or solid material. In the latter case, the solid material is melted as required to form a liquid which can be ejected by a drop-on-demand printing system.

In one arrangement, aqueous solutions of metal (gold) Au nanoparticles are prepared according the methods disclosed in the PCT Publication No. WO 03/018645, which is incorporated herein by cross-reference. These solutions can be deposited on a substrate and irradiated (cured) using an electromagnetic radiation source such as a Xenon photo flash to form conductive films that have substantially lower resistance than the non-irradiated deposited material. This process is disclosed in the PCT Publication No. WO 03/018645. The electromagnetic source interacts with the deposited material to effect a change in electrical properties of the material.

In the arrangement described herein, one or more electromagnetic sources can be used to irradiate deposited material for the purposes of controlling the final resistance of the cured material. These irradiation sources can include but are not limited to Xenon photo flash units (e.g., Canon Model 550 EX), UV light sources, laser or laser diodes light sources and/or laser diode arrays.

The resistance of the irradiated films can be controlled by specifying parameters of the irradiation such as radiation source, intensity, duration, spatial resolution, and delay between material deposition and irradiation. These parameters are preferably controlled for the substructures within a structure. In other words, the electrical properties of the printed (i.e. deposited and cured) materials can be tuned by specifying the irradiation parameters for individual parts of the structure to be formed. For example, if the structure to be formed is a field effect transistor then different irradiation properties can be defined for each of the substructures comprising source and drain electrodes, the insulating layer and the semiconducting element of the field effect transistor. In alternative arrangements the irradiation parameters for structures are controlled at a point or pixel level.

The word "curing" is often used synonymously to refer, on the one hand to polymerisation of polymers and, on the other hand, to the sintering or annealing of metal nanoparticles. However, the physical processes involved are very different. Curing of polymers involves initiating reactions, which form bonds between monomer components or cross-linking different organic ink constituents. Annealing or sintering of metal nanoparticles refers to a process whereby the individual nanoparticles are brought closer or fuse to facilitate better electron flow through the deposited material. The currently described arrangement relies on the latter process, whereby the irradiation parameters are used to control the electrical properties of the deposited material. The word "curing" is used in this description in the broad sense of effecting changes in physical (including chemical and electrical) properties of materials.

However, with appropriate amendments, the described arrangements may also be used with irradiation sources for the purpose of control of polymerisation or solidification. In these alternative arrangements, the ability to program the irradiation parameters for a structure may be used to control the final physical properties of the formed structure. In addition, it is possible to have a printing system for curing plastic moulding containing conductive elements. This system may contain a UV irradiation source for the polymer material used for the plastic moulding and a further laser or Xenon photo flash irradiation source to control the resistance of the conductive elements that are contained within the plastic moulding.

Previously disclosed curing methods for liquid polymers have not allowed programmed control over the parameters of the irradiation (e.g., radiation source, intensity, duration, density of irradiation exposure points, and delay between printing and curing). Using the described arrangements, it is possible to specify specific irradiation properties for individual objects (or substructures) of the structure to be formed and thus control the physical properties of the structure being formed. For example, the curing intensity can be varied to ensure more complete curing of particular parts (e.g., surfaces) of a three-dimensional structure. In another example, different curing intensities can be easily programmed for different materials. This means a new material, which requires a higher or lower curing intensity, can be easily added to the system without any hardware or firmware changes.

The arrangement described with reference to the drawings provides a system for forming conductive circuit elements that have programmable final resistances, using a thermal inkjet device. The final resistance of a conductive element depends both on the material used and the irradiation parameters used in the cure step of the formation process. These parameters can be designed and stored within a CAD-based digital representation of the structure to be formed. This digital representation is used by a thermal inkjet printing device to form the designed structure with the desired electrical properties.

The structures formed using the described methods may be used in or comprise radio-frequency identification tags, batteries, fuel cells, photovoltaic devices, driving electronics for flexible displays and microsensors.

Printing System

Figure 4A:
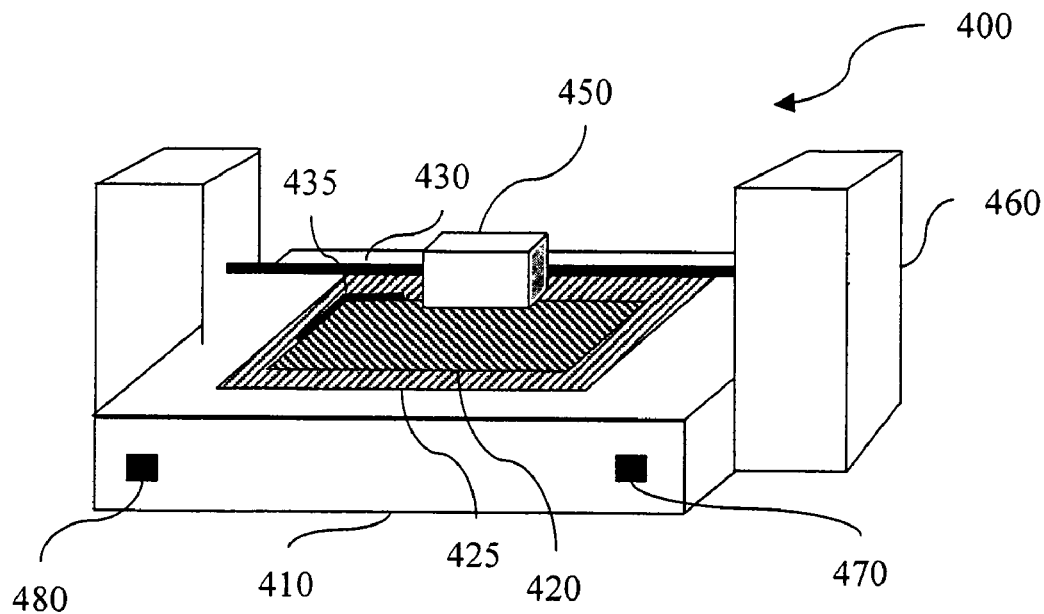
FIG. 4A shows a printing system that may be used to perform the method of FIG. 1.
Figure 4B:
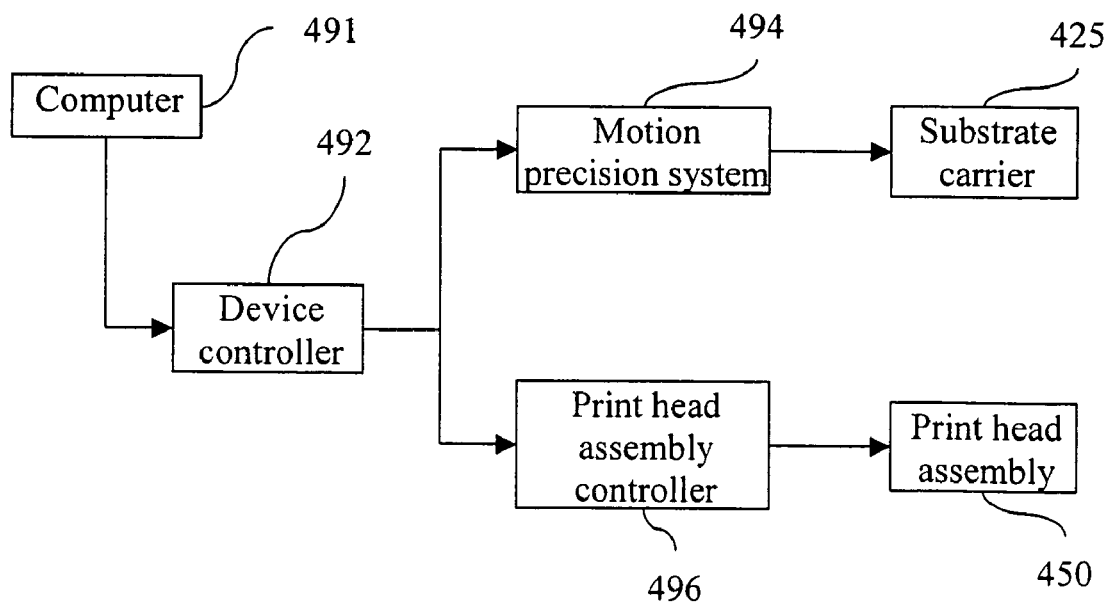
FIG. 4B is a schematic block diagram of the control system of the printing system of FIG. 4A.

A printing system 400 shown in FIGS. 4A and 4B may be used to perform the described methods. FIG. 4A depicts the printing system 400 in rear view. A print head assembly 450 is mounted at the centre of a fixed track 430 over a substrate 420. The substrate 420 is supported on a flat substrate carrier 425 and the substrate carrier 425 is controlled to move in the x, y and z-axis by a motion precision system 494 (in FIG. 4B) contained in the device base 410. The motion precision system 494 uses stepper motors to control the position of the substrate carrier 425 with respect to the device base 410 and the fixed print head assembly 450. In one arrangement, the motion precision system 494 used by the printing system 400 has a resolution of 0.0106 mm/step in each of the x, y and z axes.

The substrate 420 can be any suitable receiving surface for the deposited material. Suitable substrates include but are not limited to flexible substrates such as polyester or polyvinyl alcohol films and coated papers commonly used for inkjet photo printing (e.g., Canon Photo Paper Pro™ and fumed silica coated papers produced by Mitsubishi Paper Mills Limited). The substrate 420 is constrained to the substrate carrier 425 by suction. Alternatively, the substrate 420 can be fixed to the substrate carrier 425 by adhesive mounts or acrylic backing films. A set of intersecting perpendicular metal guides 435 are provided on the substrate carrier 420 to enable the substrate 420 to be correctly aligned on the substrate carrier 425.

The print device housing 460 has two units fixed to opposite sides of the device base 410. The print device housing 460 physically supports the fixed track 430 on which the print head assembly 450 is mounted. The housing 460 also contains a print head assembly controller 496 (in FIG. 4B) which sends electrical signals to the print head assembly 450 via connections housed in the fixed track 430. These signals control the individual nozzles that are to fire (i.e., dispense material) and initiate irradiation pulses from radiation sources fixed to the print head assembly 450. In the described arrangement the print head assembly 450 does not move along the fixed track 430. Instead, the motion precision system 494 moves the substrate carrier 425 to be positioned at the correct (x,y,z) location under the print head assembly 450.

On the rear of the device base 410 is located the power source connection 470 and a Universal Serial Bus (USB) port connection 480. Preferably, the driving software located on a computer 491 can communicate with a device controller 492 directly using the USB connection 480. In alternative arrangements, the driving software located on a computer 491 may communicate with the device controller 492 via a parallel port or an Ethernet network connection. The device controller 492 is located in the device base 410. The device controller 492 communicates directly with the print head assembly controller 496 and the motion precision system 494. In turn, the print head assembly controller 496 communicates with the print head assembly 450, and the motion precision system 494 communicates with the substrate carrier 425. The front panel of the housing 460 (not shown in FIG. 4) contains a switch for turning the device on and off.

Figure 10:
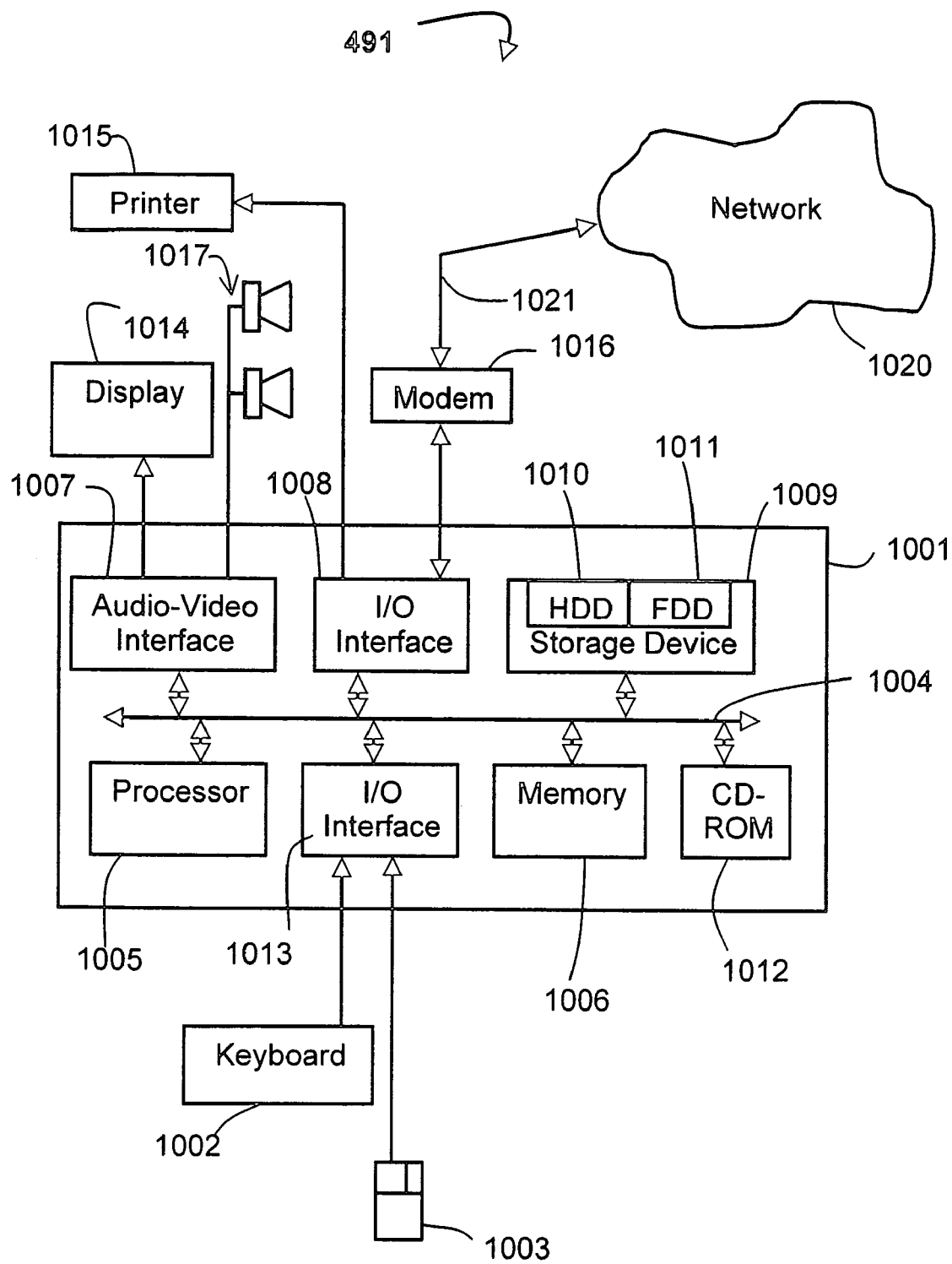
FIG. 10 is a schematic diagram of a computer on which steps of the described methods may be performed.

The computer 491 in which the driving software operates may be specially constructed for the required purposes, or may comprise a general purpose computer or other device selectively activated or reconfigured by a computer program stored in the computer. The algorithms and displays presented herein are not inherently related to any particular computer or other apparatus. The structure of a conventional general purpose computer is illustrated in FIG. 10.

The computer program running on the computer 491 may be stored on any computer readable storage medium, including storage devices such as magnetic or optical disks, memory chips, or other storage devices suitable for interfacing with a general purpose computer. Computer readable transmission media that may provide the program to the computer include a hard-wired medium such as exemplified in the Internet system, or wireless medium such as exemplified in the GSM mobile telephone system.

The computer system 491 may be formed by a computer module 1001, input devices such as a keyboard 1002 and mouse 1003, output devices including a printer 1015, a display device 1014 and loudspeakers 1017. A Modulator-Demodulator (Modem) transceiver device 1016 is used by the computer module 1001 for communicating to and from a communications network 1020, for example connectable via a telephone line 1021 or other functional medium. The modem 1016 can be used to obtain access to the Internet, and other network systems, such as a Local Area Network (LAN) or a Wide Area Network (WAN), and may be incorporated into the computer module 1001 in some implementations.

The computer module 1001 typically includes at least one processor unit 1005, and a memory unit 1006, for example formed from semiconductor random access memory (RAM) and read only memory (ROM). The module 1001 also includes an number of input/output (I/O) interfaces including an audio-video interface 1007 that couples to the video display 1014 and loudspeakers 1017, an I/O interface 1013 for the keyboard 1002 and mouse 1003 and optionally a joystick (not illustrated), and an interface 1008 for the modem 1016 and printer 1015. In some implementations, the modem 1016 may be incorporated within the computer module 1001, for example within the interface 1008. A storage device 1009 is provided and typically includes a hard disk drive 1010 and a floppy disk drive 1011. A magnetic tape drive (not illustrated) may also be used. A CD-ROM drive 1012 is typically provided as a non-volatile source of data. The components 1005 to 1013 of the computer module 1001, typically communicate via an interconnected bus 1004 and in a manner which results in a conventional mode of operation of the computer system 491 known to those in the relevant art. Examples of computers on which the described arrangements can be practised include IBM-PCs and compatibles, Sun Sparcstations or alike computer systems evolved therefrom.

Typically, the application program is resident on the hard disk drive 1010 and read and controlled in its execution by the processor 1005. Intermediate storage of the program and any data fetched from the network 1020 may be accomplished using the semiconductor memory 1006, possibly in concert with the hard disk drive 1010. Still further, the software can also be loaded into the computer system 491 from other computer readable media.

Figure 5:
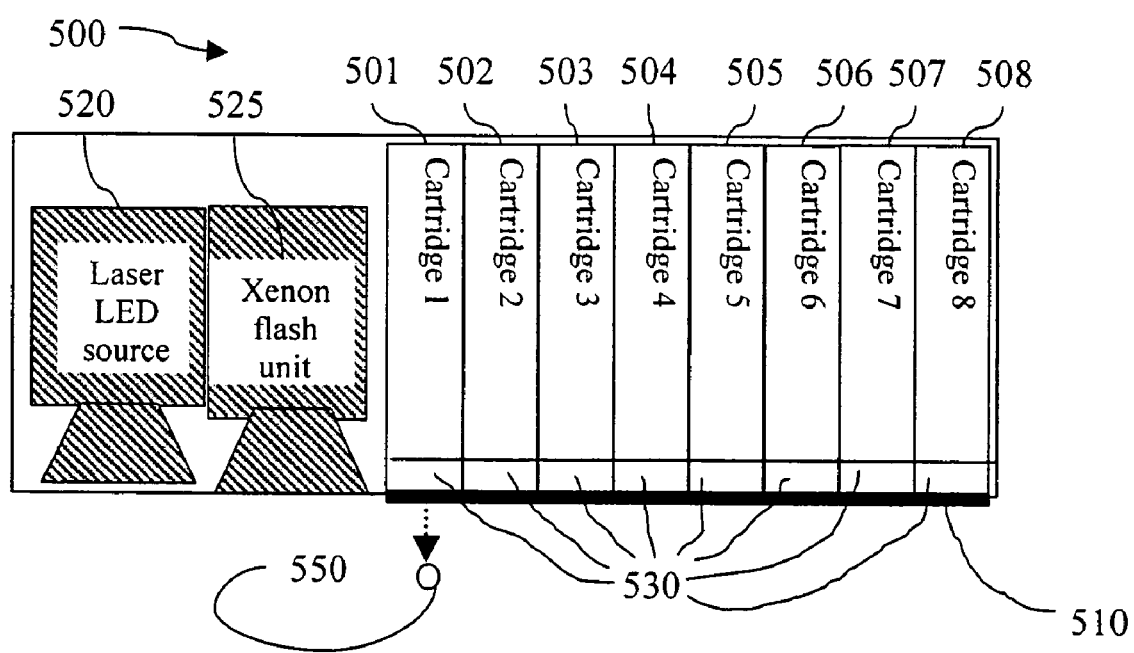
FIG. 5 is a schematic diagram of the print head assembly used by the printing system of FIG. 4A.

FIG. 5 shows an example 500 of the print head assembly 450. The exemplary print head assembly 500 contains eight ink/material cartridges 501, 502, 503, 504, 505, 506, 507 and 508. These cartridges can be used to store materials that have different electrical properties (e.g., highly conductive, moderately conductive, insulating, semiconducting, etc.). Other arrangements may use a different number of material cartridges. Below each cartridge 501-508 is a corresponding print head 530 mounted on a print head surface 510. The print head assembly 500 receives electrical signals from the print head assembly controller 496 (contained within the device housing 460) that result in the ejection of droplets (e.g., 550) from specified nozzles of a specified one of the print heads 530. The distance between the print head surface 510 and the surface of the substrate 420 is controlled to be 1.5 mm. This distance is selected to ensure optimal accuracy of drop placement onto the substrate 420.

Figure 6:
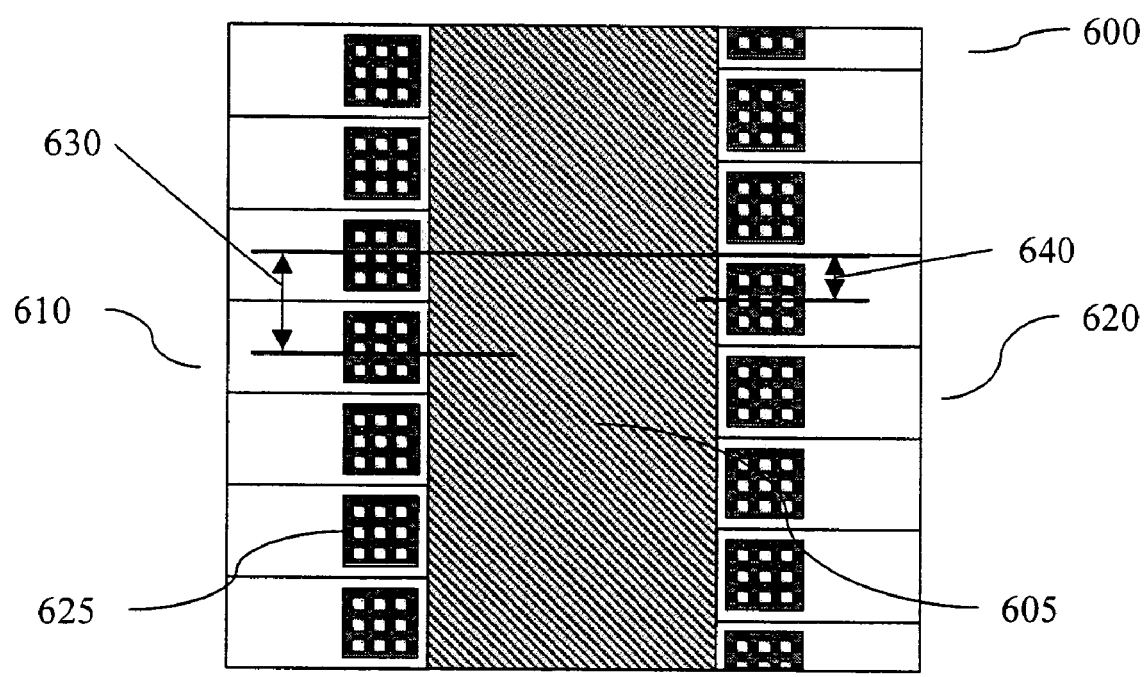
FIG. 6 is a schematic diagram showing the nozzle arrangement of an individual print head in the print head assembly of FIG. 5.

The print head 530 associated with each cartridge 501-508 is desirably a thermal inkjet print head 600 used by the Canon i9950 inkjet printer and shown in more detail in FIG. 6. Each print head 600 contains 768 thermal inkjet nozzles (such as nozzles 625). The nozzles 625 are arranged in two lines 610 and 620, each line containing 384 nozzles. The lines 610 and 620 are separated by central resin coated area 605. The spacing 630 between individual nozzles is $\frac{1}{600}$ inch (approximately 0.0423 mm). If each nozzle 625 in the line 610 ejects a single drop of material, then 600 droplets per inch can be evenly deposited in a line. The two lines of nozzles 610, 620 are offset by a distance 640, equivalent to half a nozzle. The offset 640 enables a resolvable pitch of $\frac{1}{1200}$ inch. Clearly, other print head configurations can also be used.

The printing system 400 enables material to be deposited using drop densities of 600×600 drops per inch, 1200×1200 drops per inch, and 2400×2400 drops per inch. The pitch of 2400 drops per inch is achieved using a combination of the motion precision system 494 and the inherent pitch of the print head 600 as shown by offset distance 640 in FIG. 6. For all the above drop densities the placement of drops in the x-axis is controlled by the motion precision system 494.

The print head assembly 450 shown in FIG. 5 also supports one or more irradiation sources adjacent to the material cartridges 501-508. In the described arrangement, two irradiation sources are provided: a Xenon photo flash unit 525 (as used in the Canon Model 550 EX); and a CrystaLaser™ 200 mW ultra-compact diode pumped solid-state (DPSS) green laser (532 nm) 520 available from Crystalaser of Reno, Nev., USA. The Xenon flash unit 525 acts as a broadband source of radiation and the laser 520 as a narrowband source.

The irradiation sources 520, 525 are positioned to lie 6 mm from the surface of the substrate 420. These irradiation sources 525, 520 have different effective irradiation areas and can be used for large area and small area curing, respectively. So, for example, the Xenon flash unit 525 will effectively cure a relatively large circular area (0.5 cm$^2$). This means that the distance between irradiation points can be as large as 2 mm.

The DPSS laser irradiation source 520 is used as a small area irradiation curing source. The laser source 520 has a beam diameter (1/e$^2$) of 0.36 mm and a beam divergence of 2 mrad resulting in an effective circular cure area of 0.11 mm$^2$. This irradiation source 520 enables curing of finer features. For example, the distance between laser curing irradiation points can be as small as 180 μm. The density or spacing of irradiation exposure points (herein after referred to as exposure density) to use for a laser curing source depends on the laser beam diameter, beam divergence and whether any modulation of the beam shape is used. Irradiation sources such as lasers can also be used to irradiate continuously as the substrate 420 is moved by the motion precision system 494.

In the described arrangement, no special optics (e.g., reflectors or lens) are used to control the divergence of the laser beam. However, in alternative arrangements, reflectors and/or lens may be used to modulate the beam shape and consequently control the effective resolution of an irradiation source. Furthermore, radiation can be delivered to the substrate using optical fibres. For example, UV radiation from a quartz halogen lamp contained in the device housing 460 could be supplied to the substrate 420 via an optical fibre.

Arrays of light emitting diodes (LEDs), as sourced from companies like TheLEDlight.com of Carson City, Nev., USA, can also be used for low exposure density curing (i.e., large area curing). Similarly, other compact laser sources could also be used for high exposure density curing. Laser wavelengths in the 500 to 540 nm wavelength have been found to be suitable for the curing of the nanoparticle inks used by the described arrangement. Other laser wavelengths may be used for different nano-ink preparations.

In an alternative arrangement, a number of individual identical irradiation sources are mounted in an array, separate from the print head, and moved to lie over a raster line of the structure to be cured. The individual cure intensities are loaded into local memories associated with the irradiation sources and then the array is initiated to flash together. The array is then moved to lie over the next raster line in the structure to be cured. This arrangement may be used when large structures need to be formed quickly. However, when fine control is required over the delay between printing and curing and the structures to be cured are relatively small, the speed advantage of line curing over point curing may not be as significant.

Formation of Structures Using Nanoparticle Materials

Preferably, the conductive elements are formed by depositing and curing aqueous solutions containing metal Au nanoparticles which have been prepared as described in the PCT Publication No. WO 03/018645. Preferably the aqueous inks have a surface tension of ~32-34 mN/m and a viscosity of ~10-15 mPa·s. These solution properties ensure that the drops are ejected in a reliable manner by the print system 400 with a well-defined drop volume of 2 pL. Clearly, other suitable metal nanoparticle solutions (e.g., using silver (Ag) nanoparticles or nanoparticles containing both Au and Ag) may also be used.

In many cases, a conductive element requires many layers of material (conductive ink) to be deposited on the substrate. For example, in order to form a conductive element that can act as an antenna, many layers of conductive ink must be deposited in order to achieve the necessary skin depth required to induce a current using a radiofrequency signal. In addition, circuit elements, such as transistors, consist of several layers of materials. For a transistor (such as printed by Plastic Logic of Cambridge, UK), the semiconductor and conductive source and drain contacts must be laid down in a first layer. Then a layer of insulator must be deposited. In order for this layer to be isolating (i.e., allow no leakage of current) many layers of insulating material may need to be deposited. Finally, a conductive gate electrode must be deposited over the insulator. This means that the structure to be printed involves the deposition of many layers of one or more types of materials. Each of the layers, and indeed components of each layer, may require a different irradiation process to be performed.

Digital Representation

Figure 9:
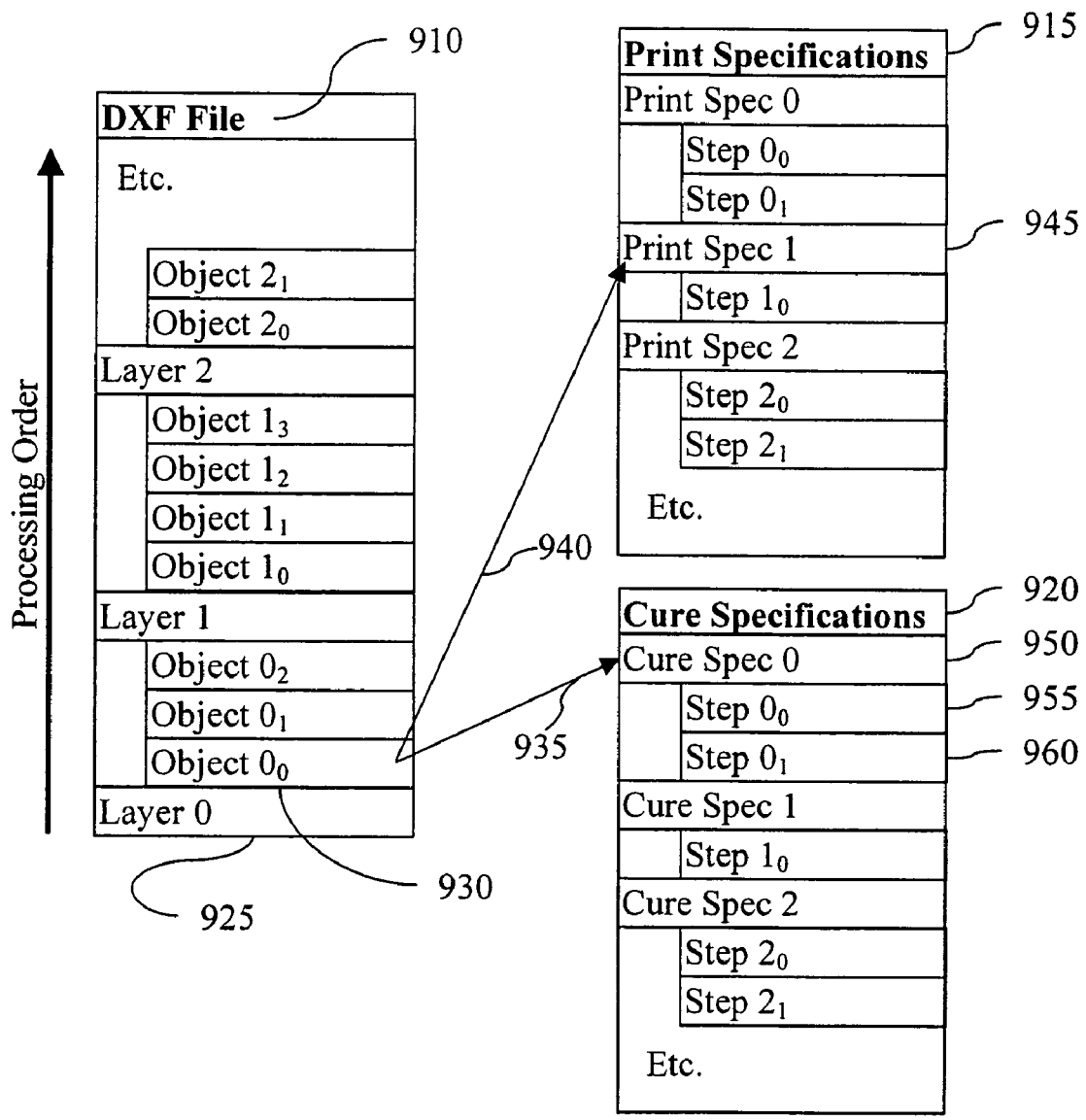
FIG. 9 is a schematic diagram depicting the digital representation of a structure to be formed by the method of FIG. 1.

The structures to be formed may be represented or specified digitally as a collection of layered objects, or substructures as shown in FIG. 9. In addition to location and size, each object is associated with print and cure specifications. The digital representation, incorporating the print and cure specifications describes the objects and circuit element formed thereby, and may be formed by the computer system of FIG. 10 and transmitted to and received by a printer such as the printer 400.

The print specification for an object includes a sequence of one or more printing steps that are to be performed for the object. Each printing step identifies the cartridge 501-508, and therefore material, to be used to print the object. The printing step also specifies the drop density (i.e., drops per inch) to be used in the printing.

The cure specification for an object includes a sequence of zero or more curing steps to be performed for the object. Each curing step identifies an irradiation source 520, 525 to be used to cure the object, together with the irradiation intensity to be used, the duration of the irradiation, the density of irradiation exposure points, and the delay between printing and curing the object.

A number of curing steps may be required to obtain a desired curing result. For example, a repeated curing step may result in a conductive track having a lower resistance than would be possible with a single curing step. Clearly, other printing and curing parameters could also be specified.

CAD software packages, such as TurboCAD™ (from Avanquest, UK) or AutoCAD™ (from AutoDesk), may be used to design and specify the objects of a structure and to organise the objects into layers. This information may be stored in standard CAD DXF files as shown by 910 in FIG. 9. Clearly, other data formats may also be used to store information for the layers and objects of the structure to form.

Each layer contains one or more vector objects, and each object has a number of properties including the position of the object in x-y-z coordinate space and the processing position of the object within the layer. For example, in FIG. 9 the DXF file 910 contains a number of layers. The first layer 925 contains a number of objects such as object 930.

In the preferred arrangement, collections of print specifications 915 and cure specifications 920 are stored separately from the DXF files. This means that print and cure specifications can be used by more than one DXF file. For example, the print and cure specifications to form a resistor having a specified resistance may be designed, stored and re-used for another circuit structure.

Each print and cure specification contains a number of steps. For example, cure specification 950 consists of steps 955 and 960. An object 930 in a layer in the DXF file 910 contains a reference 940 to the print specification 945 to use when printing and a reference 935 to the cure specification 950 to use when curing.

When a structure is selected to be formed, the objects for the structure are processed in layer order as indicated in FIG. 9. In other words, the first layer of objects is processed, followed by the second layer and so on. Within each layer, objects are processed in order of their assigned processing position. When each object is processed, the stored print and cure specifications, which are referenced by the DXF files, are used to control the printing and curing of the object. The specifications can be fetched when required or pre-fetched and cached for the structure or a set of structures which are to be formed.

In an alternative arrangement, each object is associated with a list of print, cure and delay steps. Details of these steps are stored in a specification file substantially similar to 915 and 920 in FIG. 9. Processing of each object in this arrangement involves retrieving and processing each of the steps in their order in the list. In this arrangement it is possible to carefully control the delay between each step.

In a further arrangement, the structure to be formed is represented as a collection of 'print' and 'cure' objects. At the time of designing the structure, each object is classified as either a 'print' or 'cure' object. Each 'print' object can have references to one or more associated 'cure' objects. In this arrangement, the structure is formed by processing the 'print' objects layer by layer. When each 'print' object is identified for processing, the associated 'cure' objects are then fetched in readiness for processing. In this arrangement, sequences of printing and curing operations can be represented by a sequence of individual 'print' and 'cure' objects which may print and cure, respectively, different parts of a substructure in the structure.

In a further arrangement, the structure to be formed is represented as a sequence of two-dimensional print and cure images. The colour channels of these print images are used to denote the materials to be printed. For example, the red colour channel of an image represented in the RGB colour space may be used to denote the material in the first cartridge of the printer. The colour channels of the cure images are used to denote the different irradiation sources that are available in the printing system. The structure is formed by processing the print and cure images to form layers of the structure. The images are processed in strict sequence (i.e., a first image is completely processed before the next image in the sequence is processed).

Alternatively, bands of a print image can be printed according to a print image and then cured according to the corresponding area in a following cure image in the image sequence. In this way, layers of material can be deposited and cured to form a three-dimensional structure.

Structure Forming Process

Figure 2:
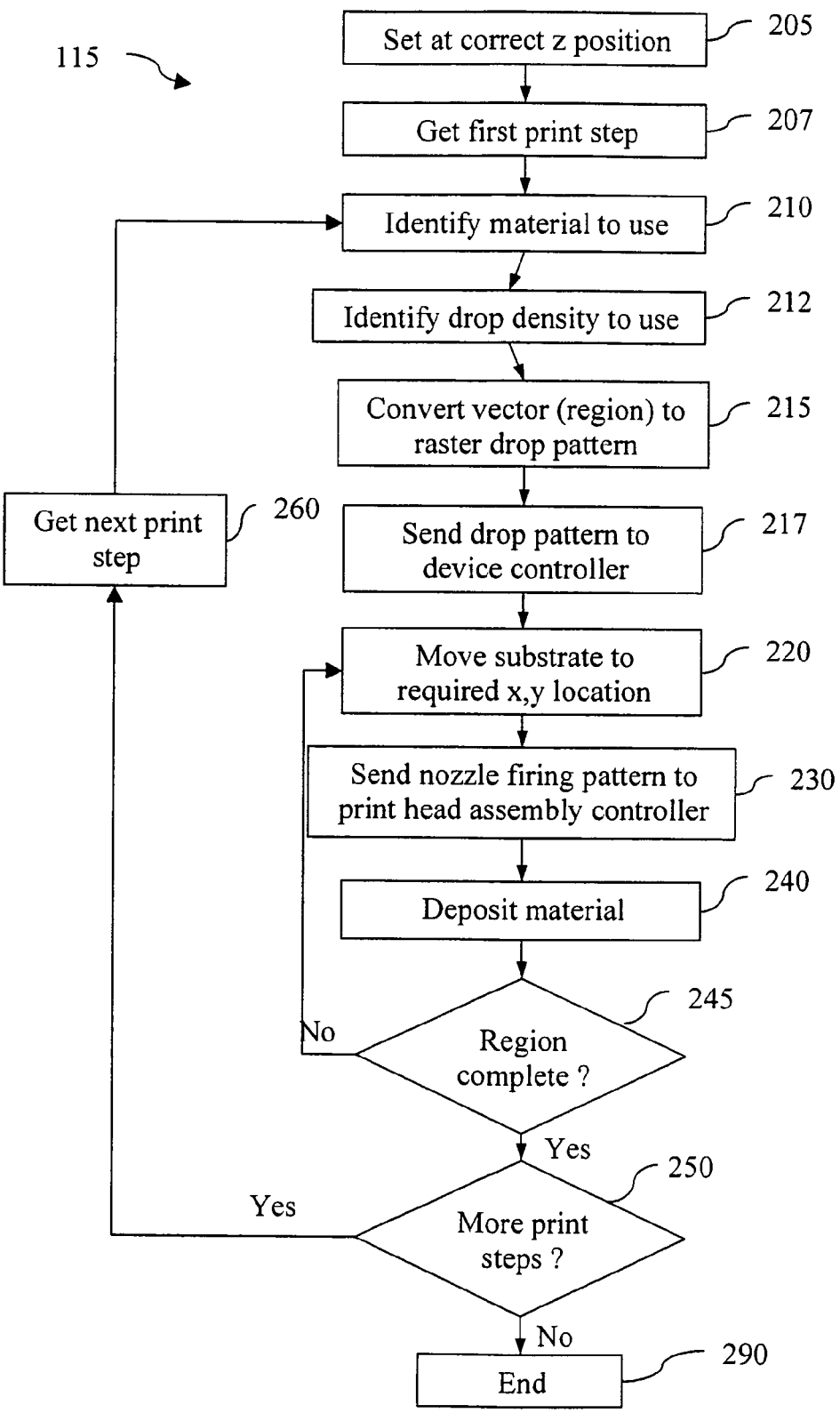
FIG. 2 is a flowchart showing a method of depositing the material required for an object of the structure formed using the method of FIG. 1.
Figure 3:
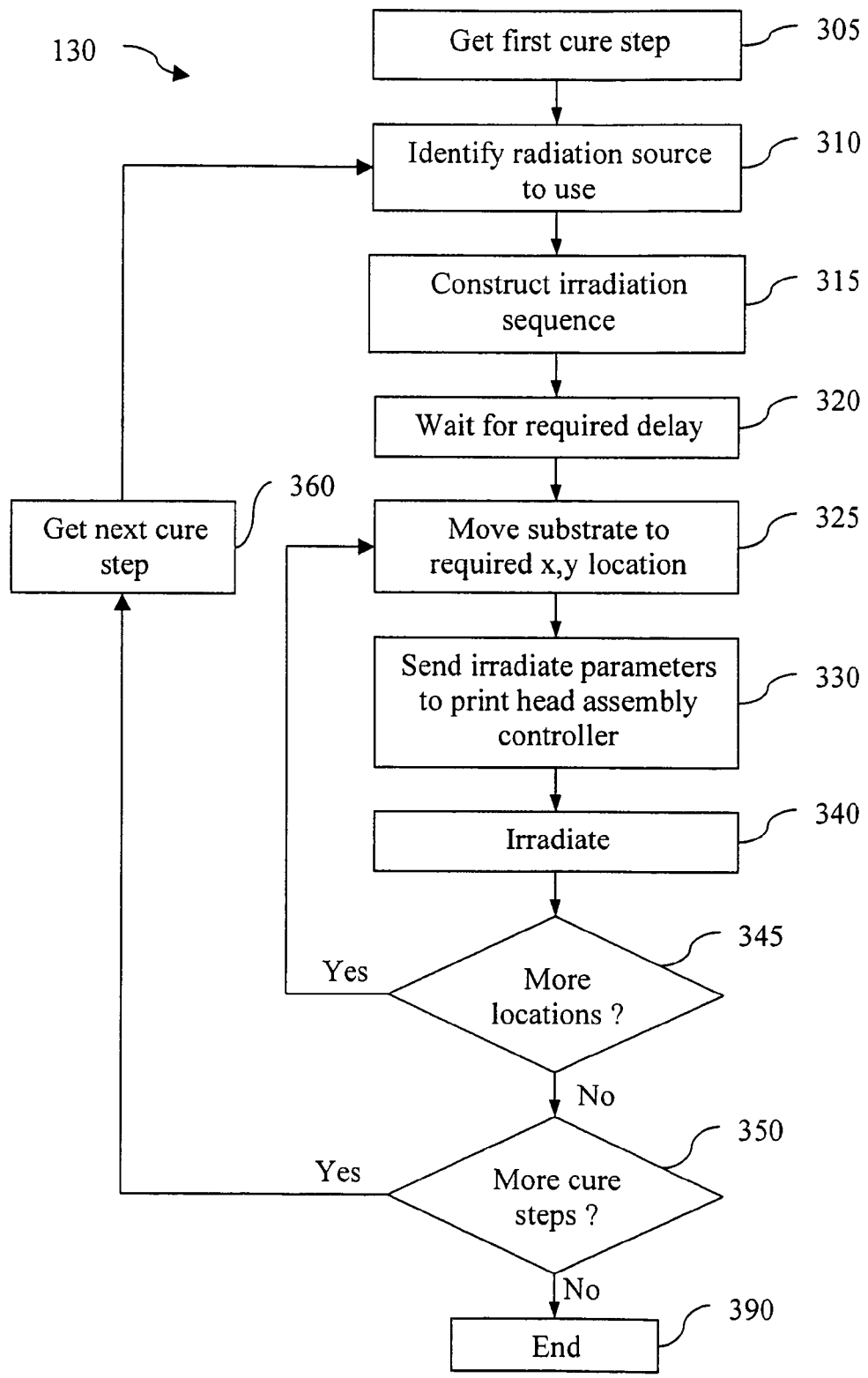
FIG. 3 is a flowchart showing a method of curing an object of the structure formed with the method of FIG. 1.

FIGS. 1 to 3 illustrate a method of forming a structure, such as a conductive element. The methods are operated in a software module located in computer 491.

In step 105 of method 100, a digital representation of the structure to be formed is selected. Preferably, this digital representation is a CAD-based representation as previously described, which references stored print and cure specifications which are to be used for the individual objects in the structure. The digital representation and the print and cure specifications may be retrieved from memory or from a storage device such as a hard disk. Instead of being retrieved, the digital representation and/or print and cure specifications may be created for one-off fabrication.

In step 110, a first object of the structure is identified for processing. Preferably, the objects of a structure are identified in layer order. Within a layer, objects are assigned a priority that determines the order in which they are processed.

In step 112, the print specification associated with the object is obtained. This specification can be fetched from a stored collection of print and cure specifications. However, in one arrangement all the required print and cure specifications required for the structure being processed are loaded as part of a pre-processing step and held in a memory cache of the software application. In step 115, the object is printed using the printing system 400 according to the print specification. This step involves converting the vector shape representing the region to be printed into the desired pattern of drops to be ejected by the print head which deposits the required material. The actual pattern to be generated depends on the drop density specified for each of the print steps of the print specification (e.g., 2400×2400 drops per inch). The method of printing the object corresponding to the current object's print specification is described in more detail below with reference to FIG. 2.

Next, in step 120 the method determines if there is an associated cure specification for the current object. If a cure specification exists (the YES option of step 120), then this cure specification is processed in step 130, which is discussed in more detail with reference to FIG. 3. If there is no cure specification for the object (the NO option of step 120) then control passes to step 140.

In step 140, the method 100 determines whether there are further objects to process. If there are (the YES option of step 140) then the next object is fetched in step 160 and control returns to step 112 to obtain the print specification for the new object. If there are no further objects to process (the NO option of step 140), then the structure is complete and the method 100 ends at step 190.

FIG. 2 shows the printing step 115 in more detail. In step 205, an initialising signal is sent to the motion precision system 494 via the device controller 492 to move the substrate 420 so that the print head assembly 450 is located at the correct height over the substrate 420. This height is specified by the z-offset given for the object.

Then in step 207, the first print step of the print specification is obtained. An object may have more than one print step in a print specification. In the described arrangement, all print steps for an object use the vector shape and the x,y, and z initial coordinates specified for the object. Multiple print steps can be used to print more than one layer of one or more materials without curing. These additional layers are assumed to result in minimal change in the distance between the print head assembly 450 and the substrate 420.

In step 210, the correct material/cartridge 501-508 is identified using the material code stored with the print step and in step 212 the drop density required to be used by the print step is also identified. In step 215 the vector associated with the object is converted into a raster drop pattern using the identified required drop density. The drop density may vary for the different print steps performed for an object. High drop densities and printing more than one layer of an object before curing can be used to deposit a larger amount of material before the curing process commences for the object. For example, when depositing insulating materials, it is important to create an isolating layer, so typically a high drop density is used. The drop density used also depends on how well the substrate can absorb the deposited material. Depositing too much material before curing can result in over-wetting of the substrate. The preferred method of constructing the raster drop pattern for the vector objects uses the GNU libxmi vector to raster conversion library available from the Free Software Foundation, Inc of Boston, Mass., USA. Clearly, other vector to raster algorithms could also be used.

In step 217, the raster drop pattern is sent with a cartridge identifier and the initial (x,y) location for the region, to the device controller 492 in the device base 410. The function of the device controller 492 is to construct a set of nozzle firing patterns at particular (x,y) locations that, summed together, will form the drop pattern that the controller 492 has received for the object. Controller 492 then controls a series of operations involving moving the substrate 420 to lie under the print head assembly 450 at the correct (x,y) location and then initiating the print head assembly 450 to deposit the correct material according to the provided nozzle firing pattern.

In step 220, the device controller 492 sends a signal to the motion precision system 494 to position the substrate 420 at the first of the constructed (x,y) locations under the fixed print head assembly 450. Then in step 230, the controller 492 sends the corresponding nozzle firing pattern and cartridge identifier to the print head assembly controller 496. The print head assembly controller 496 then sends the signals to the print head assembly 450, which results in material being deposited by the correct print head 600 according to the nozzle firing pattern (step 240). The signals result in current being applied to the heating elements of individual nozzles (e.g., 625) of the print head 600 and droplets of material being ejected onto the substrate 420.

As described previously, nozzles from both lines of nozzles 610 and 620 can be fired simultaneously. In other words, effectively two lines of dots can be simultaneously ejected for each substrate location. Higher drop densities in the y-axis than 1200 drops per inch can be achieved by using the motion precision system 494 to accurately position the substrate 420 under the print head assembly 450. Clearly, the device controller 492 may be implemented to support other drop densities (print resolutions) provided that the motion precision system 494 can support the required resolution.

In the described arrangement, each print step is associated with a single material code. This means that at any one time, nozzles from only one print head 600 can be firing. Alternative arrangements could allow material from more than one print head 600 to be deposited simultaneously therefore providing either:

(i) faster material deposition; or
(ii) deposition of additional materials required for curing (e.g., polymerisation initiators, catalysts, cofactors).

In step 245, if the region represented by the raster drop pattern received by the device controller 492 is complete, then control passes to step 250. If the further deposition of material is required in step 245 (the NO option of step 245), then control returns to step 220 and the motion precision system 494 is signalled to move the substrate to the next determined (x,y) position and material deposition for the region continues. If all the drops of the current region have been deposited (the YES option of step 245) then control passes to step 250, where a test is performed to see if there are further print steps for the current object. If no further print steps exist (the NO option of step 250), the printing method 200 concludes at step 290. If there are further print steps, control flow proceeds to step 260 to get the next print step, following which the method 115 returns to step 210 to process the retrieved print step.

The preferred method by which the nozzle firing patterns are generated by the device controller 492 (i.e. step 230) for a drop pattern uses a lookup table to associate sequences of nozzle firing patterns for each of the supported dot densities. So, for example, to deposit a 600×600 drops per inch region, all the nozzles of one line of nozzles can be fired and the motion precision system 494 can be used to move the substrate $1/600^{th}$ inch to the left and the nozzles from the same line of nozzles are fired at this new location. The process is repeated until material has been deposited over a region of the required width. The higher drop densities can use patterns which utilise both lines of nozzles 610, 620. The lookup table may incorporate nozzle firing patterns that minimise the effect of systematic artefacts that may occur if one or more nozzles is either not firing (e.g., clogged) or firing unpredictably.

In the described arrangement, the device controller 492 constructs the sequence of nozzle firing patterns required to form the raster drop pattern, which is received from the computer 491 via the USB port 480 of the printing system 400. In alternative arrangements, the nozzle firing patterns could be constructed in software in the computer 491 and then sent to the printing system 400 as a sequence of (x,y) locations and associated nozzle firing patterns.

The method 130 of curing the object will now be described with reference to FIG. 3. In the described arrangement, it is assumed that the distance between the substrate 420 and the print head assembly 450 (i.e., z position for the object) is correctly set after the printing process 200. In step 305, the first cure step of the cure specification is obtained. The radiation source 520, 525 to use for the current cure step is identified in step 310. Then using the associated exposure density, intensity, duration and delay, an irradiation sequence is constructed for the current cure step in step 315. This sequence contains instructions to move the substrate 420 to a specified (x,y) location below the print head assembly 450, initiate irradiation of the required intensity and duration from the identified radiation source and then move to the next irradiation point. The irradiation locations are determined using the irradiation exposure density specified for the cure step.

The exposure density used to cure the object is generally independent of the drop density used to print the object. This is because the exposure density is determined by the irradiation source being used and the properties of that irradiation source. For example, as mentioned previously, a Xenon flash unit 525 integrated into the print head assembly 450 as depicted in FIG. 5 can effect curing over a region of about 0.5 cm². However, a laser radiation source 520, as described previously, will cure a much smaller area in a single pulse (~0.11 mm²).

The method 300 waits at step 320 until the required delay between printing and curing has occurred. In the described arrangement, this delay is measured from the time of the first print step for the object. In alternative arrangements, the delay could be implemented in a point-wise manner. For example, the time delay is computed for each irradiation pulse. In this case the delays are incorporated into the irradiation sequence and print times must be recorded for each irradiation point for the object's last print step. This variation means that the cure specification for an object must be fetched and used to generate an irradiation sequence template before the printing associated with the print specification can commence. As printing proceeds the actual print times can be used to instantiate the delays in the prepared irradiation sequence template.

In step 325, the motion precision system 494 moves the substrate 420 to the first (x,y) location required by the irradiation sequence. The irradiation parameters for this location are then sent to the print head assembly controller 496 in step 330. The print head assembly controller 496 then despatches the required signals to the specified irradiation source 520, 525 on the print head assembly 450. This results in the current location being irradiated in step 340.

Step 345 checks whether there are more irradiation locations in the irradiation sequence. If so, control returns to step 325 where the motion precision system 494 moves the substrate 420 to lie under the next (x,y) location in the sequence. If all (x,y) locations in the sequence have been processed (the NO option of step 345) then control passes to step 350, where it is determined whether there are any more cure steps for the current object. If there are more cure steps (the YES option of step 350), then the next cure step is obtained in step 360 and control returns to step 310. If there are no further cure steps then the method 300 ends in step 390.

Resistance of Materials

The methods have been described with reference to forming conductive elements, the final resistance values of which are controlled by the selection of the desired material and the specification of the appropriate curing parameters. Using the preferred method of preparing metal nanoparticle inks (as described in PCT Publication No. WO 03/018645), nanoparticle inks having varying properties can be prepared. The prepared nanoparticles can be capped with different inert, water-soluble, organo-sulfur capping agents. For example, alkane thiols of different chain length can be used as capping agents. The capping agents stabilize the Au nanoparticles, preventing aggregation of the nanoparticles during concentration and storage. The ink formation process involves concentrating the capped Au nanoparticles, while removing excess capping agent, inorganic salts and other impurities. The removal of these impurities is important for the formation of highly conductive nanoparticle films.

Figure 7:
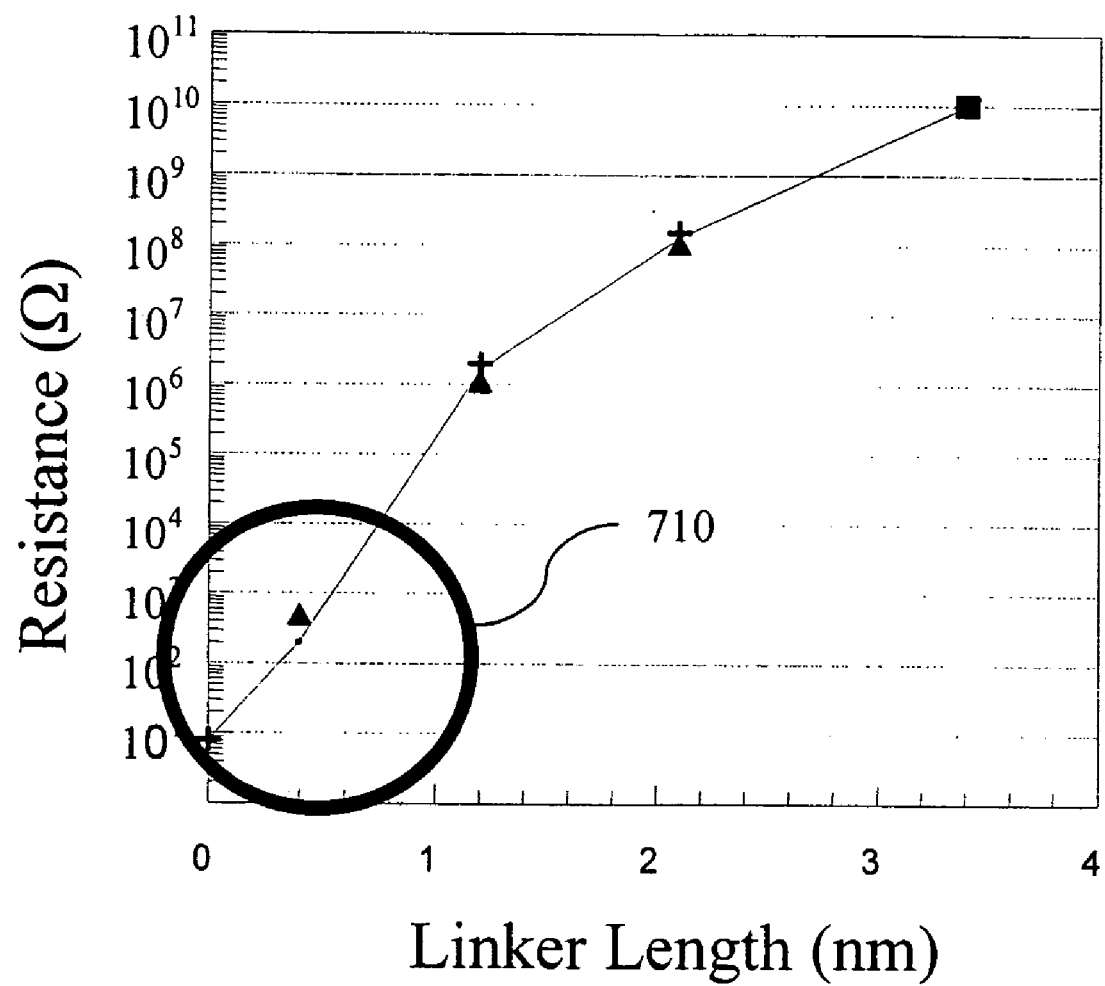
FIG. 7 is a graph showing the relationship between linker length of agents, used to cap gold (Au) nanoparticles, and resulting film resistance (before curing)

The type and length of linker molecule (capping agent) controls the interparticle distance and therefore affects the final resistances of printed films before curing. FIG. 7 shows a graph of consistently measured resistance of films printed using alkane thiols of different linker length. When the linker length of the capping agent falls below ~1 nm (as shown by portion 710 of the graph), metallic conduction characteristics are observed. Longer linker lengths make it difficult for electrons to tunnel from one nanoparticle to another in the film and therefore result in a higher film resistance. Therefore, different nanoparticle inks can be used to form conductive elements and resistors of varying resistance as a result of the different intrinsic properties of the capped nanoparticles in the ink.

Figure 8:
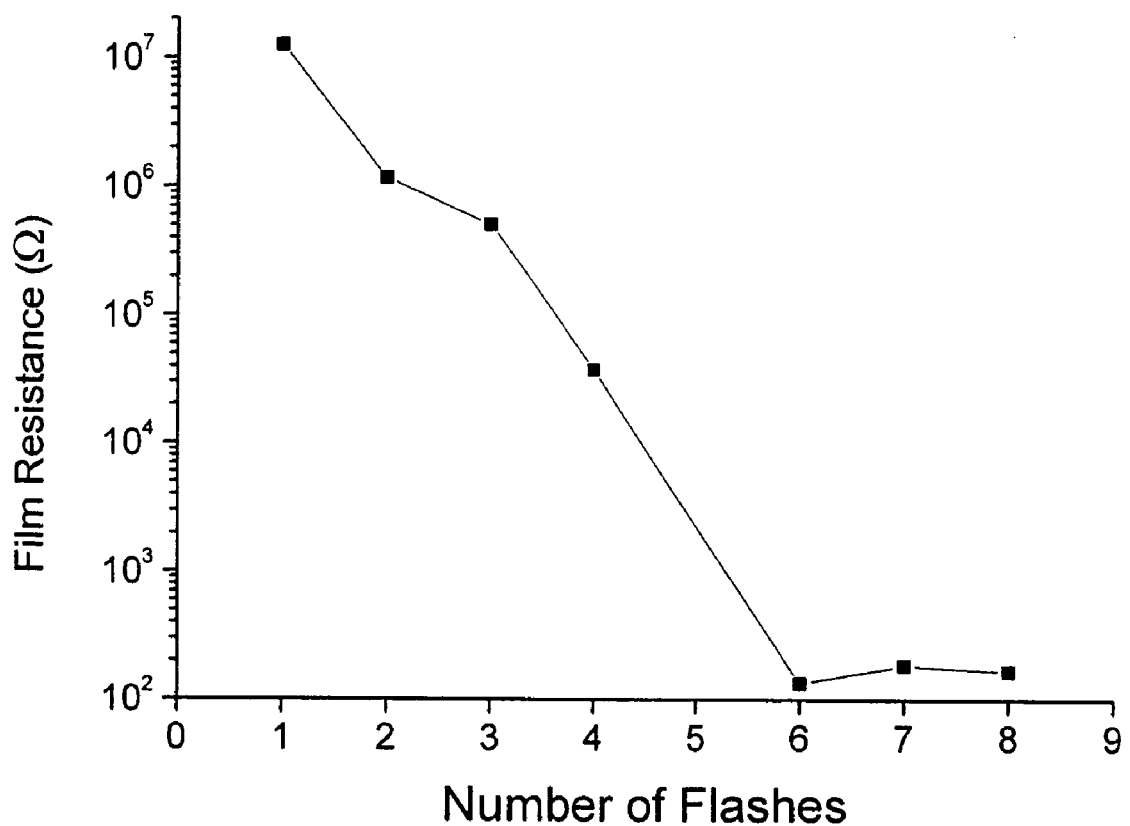
FIG. 8 is a graph showing the relationship between the number of flashes, by a Xenon flash gun, and the resulting film resistance (after curing)

The final resistances are also affected by the type of irradiation source used and parameters of the curing process. FIG. 8 shows how the sheet (film) resistance of printed nanoparticle films varies with effective irradiation duration. The films were formed by inkjet deposition of a 4% w/v capped Au nanoparticle aqueous solution on paper with a fumed silica coating (as produced by Mitsubishi Paper Mills Limited). Each printed film was exposed to a different number of discrete 200 µs flashes using a Xenon photo flash unit (Canon model 550EX) using a power setting of 40 W/cm². The sheet resistance was then measured for each film and is plotted as a function of the number of flashes in FIG. 8. The flash unit was placed a distance of 6 mm from the nanoparticle film. This result demonstrates how the resistance of films can be controlled by controlling the parameters of the curing process, such as duration of the applied irradiation. It may be seen from FIG. 8 that the film resistance decreases as the number of flashes increases from 1 to 6 flashes. For more than 6 flashes, no further decrease in resistance is seen.

The actual intensity and duration values to use for the irradiation process depend on the type of nanoparticle material used in the deposition or printing step, the effective radiation area, the distance of the material from the irradiation source and the granularity of the power control of the cure source. These values must be calibrated beforehand by measuring the obtained resistance value for each set of parameters. This calibration must be performed for each substrate used as the substrate also affects the final resistance of the printed structure. Preferably the results of these calibrations are stored in lookup tables which can be used when designing structures to be formed.

Figure 11A:
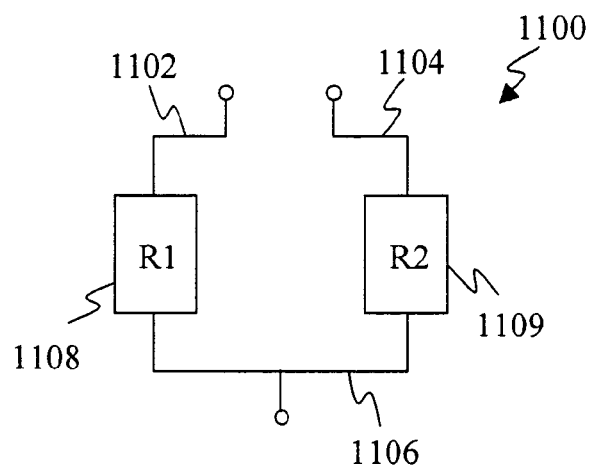
FIGS. 11A-11C show an example of the formation of a circuit element according to the present disclosure.
Figure 11B:
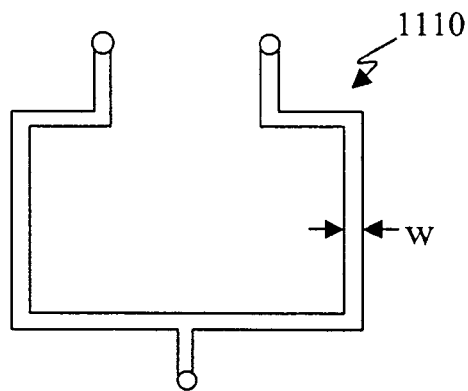

FIG. 11A shows a schematic representation of an electrical circuit 1100 formed of a resistor R1 1108 and a resistor R2 1109 in a classic "resistor-divider" configuration which incorporates three connections or terminals 1102, 1104 and 1106. FIG. 11B shows a print layout 1110 of the circuit 1100 which can be formed by the depositing of Au nanoparticle materials onto a substrate according to the principles of the present disclosure. Note that the print layout 1110 is a single structure which is configured to have multiple characteristics. Also, in order to form the resistors 1108, 1109 and connections 1102, 1104, 1106, a width W of the layout may be uniform. This contrasts other fabrication arrangements where structures or devices having differing properties require different structural configurations. For example in semiconductor manufacture, different resistor values may require different doping levels or occupy different chip areas. In this example, the different devices and characteristics are formed by the dispensing and depositing of the material, in combination with the curing process.

Figure 11C:
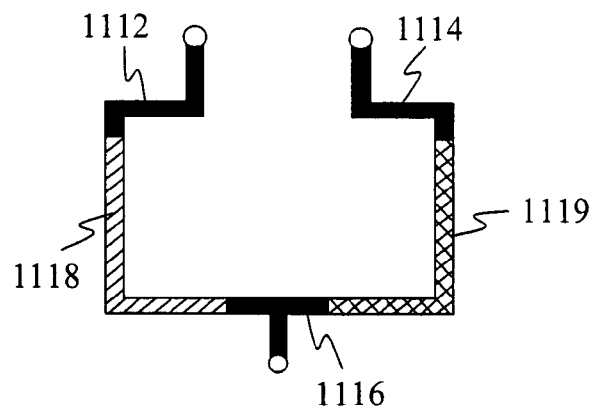

FIG. 11C illustrates the curing of the material deposited in the layout 1110. Using the graph of FIG. 8, the connections and terminals 1112, 1114 and 1116 are cured using 7 flashes of light, to ensure a low film resistance of about 300 ohms for each. The resistor R1 is formed by a portion 1118 cured using 3 flashes, giving a film resistance of about 500 k ohms. The resistor R2 is formed by a portion 1119 of the layout 1110 cured using 4 the connections 1112, 1114 and 1116 is small compared to the values of the resistors R1 and flashes, giving a film resistance of about 40k ohms. Note that the resistance of the connections 1112, 1114 and 1116 is small compared to the values of the resistors R1 and R2, and well within a 5% tolerance commonly used in electronic circuit design. More significantly, the series resistance of the connections 1112-

1116 (about 900 ohms) is less than 0.2% of the series resistance (about 540 k ohms) of the resistors R1 and R2. As such the use of varying the number of flashes to perform curing can afford predictably accurate circuit formation. Importantly, once the various sub-regions of the layout 1110 have been correspondingly cured, the layout forms a single element or structure which has multiple characteristics, in this case essentially a series connection of five resistances (300+40k+ 300+500k+300 ohms).

Figure 12:
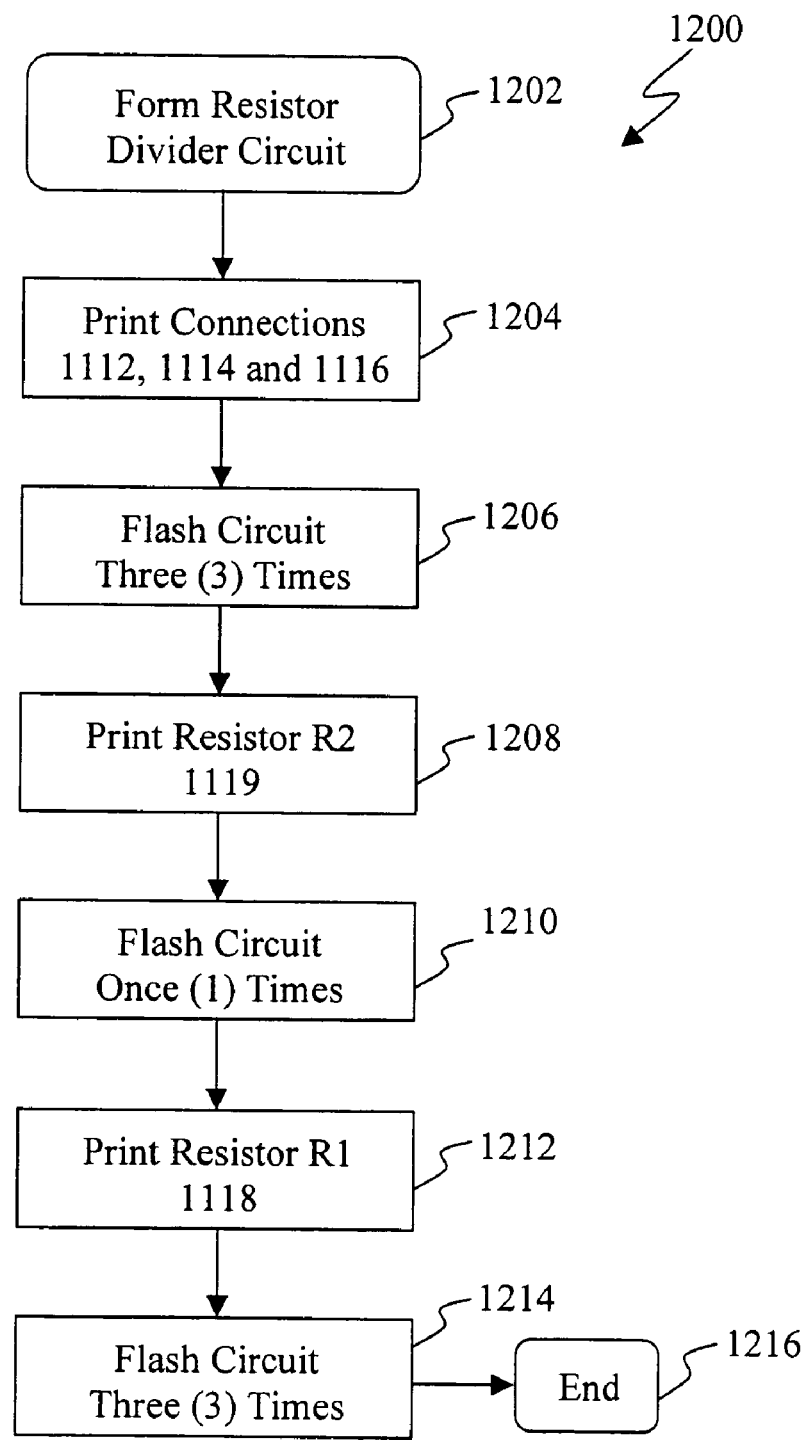
FIG. 12 is a flowchart of one method that may be used to form the circuit element of FIGS. 11A-11C.

FIG. 12 shows a flowchart 1200 of one approach that may be used to form the resistor divider of FIG. 11C. Step 1202 acts as a starting point and step 1204 operates to print the three connections 1112, 1114 and 1116. The circuit the then cured in step 1206 with three flashes, giving the connections each a resistance of 500k ohms, according to FIG. 8. Step 8 then operates to print the resistor R2 1119 between the connections 1114 and 1116. The circuit, as a whole, is then cured in step 1210 with a single flash. This causes the resistance of the connections to drop to about 40k ohms each, and the resistor R2 1119 to be about 1M ohm. Step 1212 then operates to print the resistor R1 1118 between the connections 1112 and 1116. Step 1214 then cures the entire circuit using a further 3 flashes. This gives the resistor R1 1118 a resistance of 500k ohms and changes the resistance of the connections 1112-1116 to about 300 ohms each (from a total of 7 flashes) and changes the resistance of resistor R2 to about 40k ohms (from a total of 4 flashes). The method ends at step 1216.

The method 1200 may be used where only the Xenon flash unit 525 is desired to operate, in view of its relatively large irradiation area, as discussed above. The method 1200 as such has three printing passes. Using a more focussed approach to irradiation, for example using the laser 520, a single printing pass may be used to form the circuit elements shown in FIG. 11C of the circuit 1100.

The example of FIGS. 11 and 12 provides a simple circuit element structure. Utilizing a range of nanoparticle materials including resistive, semiconducting, insulating etc., as discussed above, circuit elements may be formed each having multiple characteristics. The characteristics may arise from the deposited material, the mode of curing, or a combination of both. Further, the structuring of individual circuit elements can provide for complex circuits to be formed in 2 or 3 dimensions.

INDUSTRIAL APPLICABILITY

It is apparent from the above that the arrangements described are applicable to the electronics and printing industries.

The foregoing describes only some embodiments of the present invention, and modifications and/or changes can be made thereto without departing from the scope and spirit of the invention, the embodiments being illustrative and not restrictive.

We claim:

1. An apparatus for forming a structure on a substrate, the apparatus comprising:

a computer arranged to select a digital specification for a structure and to identify at least one region in the digital specification;

a drop-on-demand printer coupled to the computer and configured to print the at least one identified region by depositing at least one material on the substrate according to the digital specification; and at least one electromagnetic radiation source coupled to the computer and configured to cure the at least one identified region according to the digital specification by irradiating the deposited material with electromagnetic radiation according to an irradiation intensity and a location of an irradiation point in the at least one identified region specified by the digital specification.

2. An apparatus according to claim 1, wherein the drop-on-demand printer includes an ink-jet print head assembly that includes:

at least one cartridge for storing material to be dispensed, a print head corresponding to each of the at least one cartridge for dispensing the material onto a substrate, and a plurality of electromagnetic radiation sources each configured to cure the dispensed material by irradiation thereof.

3. An apparatus according to claim 2, wherein the ink-jet print head assembly receives signals that control a firing of a nozzle of each print head corresponding to each of the at least one cartridge and that initiate radiation pulses of the plurality of electromagnetic radiation sources.

4. A system for forming a structure on a substrate, the system comprising:

a data storage unit that includes one or more digital specifications for structures; and a drop-on-demand printer in communication with the data storage units for forming a selected structure, the printer including:

one or more cartridges for dispensing material to thereby deposit the material onto a substrate using a drop-on-demand technique according to a digital specification for the selected structure, and one or more sources of electromagnetic radiation for curing the deposited material by irradiating the deposited material with electromagnetic radiation according to an irradiation intensity and a location of an irradiation point on the substrate specified by the digital specification for the selected structure.

5. A system according to claim 4, wherein the printer further includes a print head assembly with one or more print heads.

6. A system according to claim 5, wherein the printer further includes a positioning system to control a position of the substrate relative to the one or more print heads and the one or more sources of electromagnetic radiation.

* * * * *